United States Patent
Yang et al.

(10) Patent No.: US 8,880,367 B1
(45) Date of Patent: Nov. 4, 2014

(54) METHOD FOR ACCURATELY PERFORMING POWER ESTIMATION ON A BATTERY OF AN ELECTRONIC DEVICE, AND ASSOCIATED APPARATUS

(75) Inventors: Chi-Yu Yang, Hsinchu (TW); Ming-Hsien Lee, Hsinchu (TW)

(73) Assignee: Energy Pass Incorporation, Hsinchu Science Park, Hsinchu (TW)

( * ) Notice: Subject to any disclaimer, the term of this patent is extended or adjusted under 35 U.S.C. 154(b) by 539 days.

(21) Appl. No.: 13/293,132

(22) Filed: Nov. 10, 2011

(51) Int. Cl.
*G01R 31/36* (2006.01)
*G01R 19/165* (2006.01)

(52) U.S. Cl.
CPC ........ *G01R 31/3679* (2013.01); *G01R 31/3651* (2013.01); *G01R 31/3648* (2013.01); *G01R 19/16542* (2013.01)
USPC .................. 702/63; 702/60; 702/61; 702/64; 702/66; 320/132; 320/137; 320/157

(58) Field of Classification Search
USPC .......................................................... 702/63
See application file for complete search history.

(56) References Cited

U.S. PATENT DOCUMENTS

| | | | |
|---|---|---|---|
| 4,433,294 A * | 2/1984 | Windebank | 324/426 |
| 5,895,440 A * | 4/1999 | Proctor et al. | 702/63 |
| 6,252,380 B1 * | 6/2001 | Koenck | 320/150 |
| 7,518,340 B2 * | 4/2009 | Sterz et al. | 320/132 |
| 2005/0046389 A1 * | 3/2005 | Kim | 320/132 |
| 2008/0290839 A1 * | 11/2008 | Hayashi | 320/137 |
| 2010/0213947 A1 * | 8/2010 | Rajpara et al. | 324/433 |
| 2010/0244780 A1 * | 9/2010 | Turner et al. | 320/162 |
| 2011/0128006 A1 * | 6/2011 | Ren et al. | 324/426 |
| 2012/0235409 A1 * | 9/2012 | Zhang | 290/44 |
| 2013/0073236 A1 * | 3/2013 | Wu et al. | 702/63 |

FOREIGN PATENT DOCUMENTS

WO    WO 2011098771 A1 *    8/2011

* cited by examiner

*Primary Examiner* — Sujoy Kundu
*Assistant Examiner* — Paul D Lee
(74) *Attorney, Agent, or Firm* — Winston Hsu; Scott Margo (57) ABSTRACT

A method for accurately performing power estimation on a battery of an electronic device includes: monitoring a charging current of the battery to obtain charging current data of the charging current with respect to time; and performing curve mapping according to the charging current data and according to a plurality of sets of predetermined curve characteristic data, in order to determine an estimation parameter corresponding to one of a plurality of predetermined cycle counts, wherein the estimation parameter is utilized for performing power estimation, and the sets of predetermined curve characteristic data respectively correspond to the predetermined cycle counts, which represent estimated ages of the battery, respectively. At least one associated apparatus is also provided.

17 Claims, 6 Drawing Sheets

|  | Cycle 3 | Cycle 50 | Cycle 100 |
|---|---|---|---|
| I=1.4~1.0A | 31 sec | 26 sec | 20 sec |
| I=1.0~0.6A | 79 sec | 68 sec | 58 sec |
| I=0.6~0.3A | 149 sec | 131 sec | 108 sec |
| I=0.3~0.1A | 339 sec | 293 sec | 278 sec |

FIG. 5

|  | Cycle 3 | Cycle 50 | Cycle 100 |
|---|---|---|---|
| I=1.4~1.0A | 35.959mAh | 29.798mAh | 23.107mAh |
| I=1.0~0.6A | 61.218mAh | 52.611mAh | 44.732mAh |
| I=0.6~0.3A | 64.194mAh | 56.260mAh | 46.235mAh |
| I=0.3~0.1A | 62.271mAh | 52.733mAh | 50.369mAh |

FIG. 6

METHOD FOR ACCURATELY PERFORMING POWER ESTIMATION ON A BATTERY OF AN ELECTRONIC DEVICE, AND ASSOCIATED APPARATUS

BACKGROUND OF THE INVENTION

1. Field of the Invention

The present invention relates to power estimation of a portable electronic device, and more particularly, to a method for accurately performing power estimation on a battery of an electronic device, and to an associated apparatus.

2. Description of the Prior Art

A conventional portable electronic device (e.g., a multi-functional mobile phone, a personal digital assistant (PDA), a tablet, etc) can be very helpful to an end user. Typically, the conventional portable electronic device is capable of performing power estimation on the battery therein, in order to notify the end user of the remaining power of the battery when needed. According to the related art, the remaining power is typically estimated according to a simple model, where the simple model may be workable based upon a fully charging/discharging condition of the battery. Some problems may occur when such a simple model is utilized. For example, the end user typically starts charging the conventional portable electronic device (more specifically, the battery therein) before the conventional portable electronic device displays/outputs a warning for charging, causing inaccuracy of the power estimation performed by the conventional portable electronic device. In another example, it seems unlikely that the simple model can cover a wide range of variations of the environment around the conventional portable electronic device. In conclusion, the related art does not serve the end user well. Thus, a novel method is required for enhancing power estimation of an electronic device.

SUMMARY OF THE INVENTION

It is therefore an objective of the claimed invention to provide a method for accurately performing power estimation on a battery of an electronic device, and to provide an associated apparatus, in order to solve the above-mentioned problems.

An exemplary embodiment of a method for accurately performing power estimation on a battery of an electronic device is provided. The method comprises the steps of: monitoring a charging current of the battery to obtain charging current data of the charging current with respect to time; and performing curve mapping according to the charging current data and according to a plurality of sets of predetermined curve characteristic data, in order to determine an estimation parameter corresponding to one of a plurality of predetermined cycle counts, wherein the estimation parameter is utilized for performing power estimation, and the sets of predetermined curve characteristic data respectively correspond to the predetermined cycle counts, which represent estimated ages of the battery, respectively.

An exemplary embodiment of an apparatus for accurately performing power estimation on a battery of an electronic device is provided, wherein the apparatus comprises at least one portion of the electronic device. The apparatus comprises a current detector, a processing circuit, and a storage, wherein the processing circuit comprises a time measurement unit, a charging current monitoring module, and a calculation module. The current detector is arranged to detect a charging current of the battery, and the processing circuit is arranged to control operations of the electronic device. In particular, the time measurement unit is arranged to perform time measurement, and the charging current monitoring module is arranged to monitor the charging current of the battery to obtain charging current data of the charging current with respect to time. In addition, the calculation module is arranged to perform curve mapping according to the charging current data and according to a plurality of sets of predetermined curve characteristic data, in order to determine an estimation parameter corresponding to one of a plurality of predetermined cycle counts, wherein the estimation parameter is utilized for performing power estimation, and the sets of predetermined curve characteristic data respectively correspond to the predetermined cycle counts, which represent estimated ages of the battery, respectively. Additionally, the storage is arranged to store information, wherein the information stored in the storage comprises the plurality of sets of predetermined curve characteristic data.

An exemplary embodiment of an apparatus for accurately performing power estimation on a battery of an electronic device is provided, wherein the apparatus comprises at least one portion of the electronic device. The apparatus comprises a voltage detector, a processing circuit, and a storage, wherein the processing circuit comprises a time measurement unit, a charging voltage monitoring module, and a calculation module. The voltage detector is arranged to detect a charging voltage of the battery, and the processing circuit is arranged to control operations of the electronic device. In particular, the time measurement unit is arranged to perform time measurement, and the charging voltage monitoring module is arranged to monitor the charging voltage of the battery to obtain charging voltage data of the charging voltage with respect to time. In addition, the calculation module is arranged to perform curve mapping according to the charging voltage data and according to a plurality of sets of predetermined curve characteristic data, in order to determine an estimation parameter corresponding to one of a plurality of predetermined cycle counts, wherein the estimation parameter is utilized for performing power estimation, and the sets of predetermined curve characteristic data respectively correspond to the predetermined cycle counts, which represent estimated ages of the battery, respectively. Additionally, the storage is arranged to store information, wherein the information stored in the storage comprises the plurality of sets of predetermined curve characteristic data.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
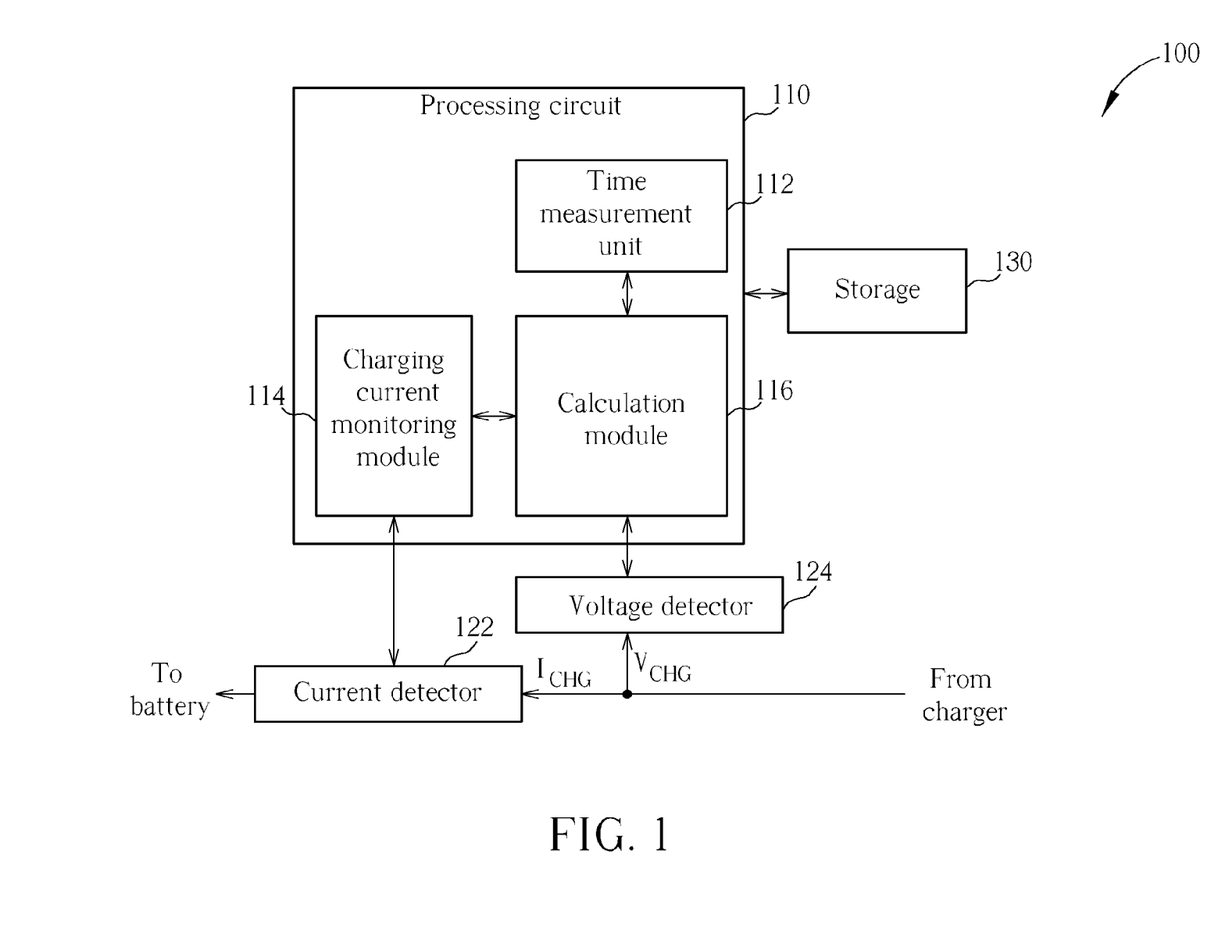
FIG. 1 is a diagram of an apparatus for accurately performing power estimation on a battery of an electronic device according to a first embodiment of the present invention.

Please refer to FIG. 1, which illustrates an apparatus 100 for accurately performing power estimation on a battery of an electronic device (more particularly, a portable electronic device) according to a first embodiment of the present invention. According to different embodiments, such as the first embodiment and some variations thereof, the apparatus 100 may comprise at least one portion (e.g. a portion or all) of the electronic device. For example, the apparatus 100 may comprise a portion of the electronic device mentioned above, and more particularly, can be a control circuit such as an integrated circuit (IC) within the electronic device. In another example, the apparatus 100 can be the whole of the electronic device mentioned above. In another example, the apparatus 100 can be an audio/video system comprising the electronic device mentioned above. Examples of the electronic device may include, but not limited to, a mobile phone (e.g. a multifunctional mobile phone), a personal digital assistant (PDA), and a personal computer such as a laptop computer or a desktop computer.

As shown in FIG. 1, the apparatus 100 comprises a processing circuit 110, a current detector 122, a voltage detector 124, and a storage 130, where the processing circuit 110 comprises a time measurement unit 112 (e.g. a time counter), a charging current monitoring module 114, and a calculation module 116. The processing circuit 110 is arranged to control operations of the electronic device, while the current detector 122 is arranged to detect a charging current $I_{CHG}$ of the battery, and the voltage detector 124 is arranged to detect a charging voltage $V_{CHG}$ of the battery. In particular, the time measurement unit 112 is arranged to perform time measurement and is capable of providing the processing circuit 110 with time measurement capability, and the charging current monitoring module 114 is arranged to monitor the charging current $I_{CHG}$ of the battery to obtain charging current data of the charging current $I_{CHG}$ with respect to time. In addition, the calculation module 116 is arranged to perform curve mapping according to the charging current data and according to a plurality of sets of predetermined curve characteristic data, in order to determine an estimation parameter $P_E$ corresponding to one of a plurality of predetermined cycle counts, where the estimation parameter $P_E$ is utilized for performing power estimation, and the sets of predetermined curve characteristic data respectively correspond to the predetermined cycle counts, which represent estimated ages of the battery, respectively. Additionally, the storage 130 is arranged to store information, where the information stored in the storage 130 comprises the plurality of sets of predetermined curve characteristic data.

According to this embodiment, the estimation parameter $P_E$ may represent the maximum possible power available in the battery, and therefore, can be referred to as the maximum power $Q_{MAX}$. In addition, the aforementioned one of the plurality of predetermined cycle counts can be the latest cycle count that represents an estimated age of the battery. For example, in a situation where the processing circuit 110 performs curve mapping to determine (or estimate) that the latest cycle count is three cycles, the estimated age of the battery corresponds to three cycles of fully charging/discharging the battery, and the battery can be considered to be a new battery. In another example, in a situation where the processing circuit 110 performs curve mapping to determine (or estimate) that the latest cycle count is five hundred cycles, the estimated age of the battery corresponds to five hundred cycles of fully charging/discharging the battery, and the battery can be considered to be an old battery. No matter whether the battery is considered to be a new battery or an old battery, as the estimation parameter $P_E$ such as the maximum power $Q_{MAX}$ (i.e. the maximum possible power available in the battery) can be accurately determined (or estimated), the processing circuit 110 can dynamically calculate (or estimate) the latest remaining power $Q_{NOW}$ of the battery with high accuracy.

In practice, the charging current data can be obtained in a constant voltage (CV) condition of charging the battery. This is for illustrative purposes only, and is not meant to be a limitation of the present invention. According to some variations of this embodiment, the charging current data may be replaced with charging voltage data, which can be obtained in a constant current (CC) condition of charging the battery when needed.

Figure 2:
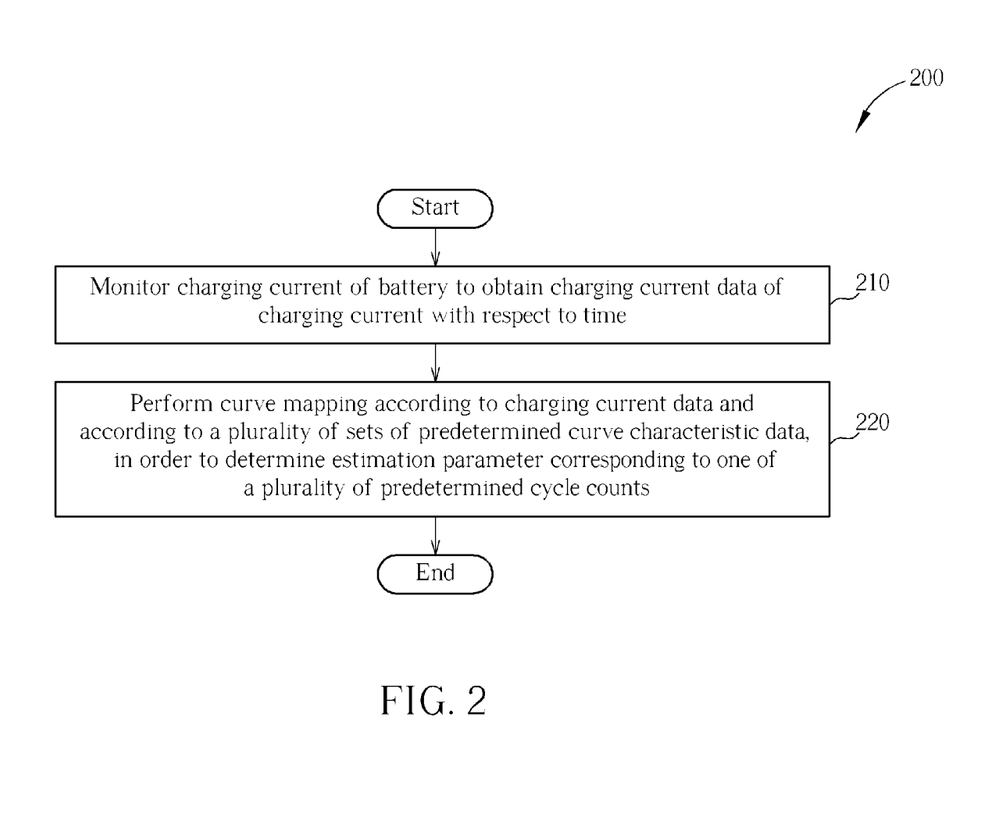
FIG. 2 illustrates a flowchart of a method for accurately performing power estimation on a battery of an electronic device according to an embodiment of the present invention.

FIG. 2 illustrates a flowchart of a method 200 for accurately performing power estimation on a battery of an electronic device according to an embodiment of the present invention. The method shown in FIG. 2 can be applied to the apparatus 100 shown in FIG. 1, and more particularly, can be applied to the processing circuit 110 mentioned above. The method is described as follows.

In Step 210, the processing circuit 110 (more particularly, the charging current monitoring module 114) monitors the charging current $I_{CHG}$ of the battery to obtain the charging current data of the charging current with respect to time. In practice, the processing circuit 110 can utilize the current detector 122 to detect the charging current $I_{CHG}$ of the battery, and further utilize the voltage detector 124 to detect the charging voltage $V_{CHG}$ of the battery, in order to make the charging current data be obtained in the CV condition of charging the battery. For example, in a situation where the charging current data is obtained in the CV condition, the charging current $I_{CHG}$ represented by the charging current data may fall at a varying speed with respect to time.

In Step 220, the processing circuit 110 (more particularly, the calculation module 116) performs curve mapping according to the charging current data and according to a plurality of sets of predetermined curve characteristic data such as the aforementioned sets of predetermined curve characteristic data, in order to determine the estimation parameter $P_E$ (e.g. the maximum power $Q_{MAX}$ mentioned above, i.e. the maximum possible power available in the battery) corresponding to one of a plurality of predetermined cycle counts such as those mentioned above, where the estimation parameter $P_E$ such as the maximum power $Q_{MAX}$ is utilized for performing power estimation, and the sets of predetermined curve characteristic data respectively correspond to the predetermined cycle counts, which represent the estimated ages of the battery, respectively.

According to this embodiment, within the plurality of sets of predetermined curve characteristic data, the calculation module 116 selects a set of predetermined curve characteristic data that matches the charging current data mentioned in Step 210. In addition, within a plurality of predetermined parameters {P} respectively corresponding to the sets of predetermined curve characteristic data, the calculation module 116 utilizes a predetermined parameter P corresponding to the selected set of predetermined curve characteristic data as the estimation parameter $P_E$. More particularly, the calculation module 116 compares at least one curve characteristic associated to the charging current data with that associated to one set of the plurality of sets of predetermined curve characteristic data, in order to determine the selected set of predetermined curve characteristic data. For example, the aforementioned at least one curve characteristic of a curve under consideration may comprise a time interval for the curve under consideration to fall from a first current value to a second current value, where the curve under consideration can be a curve associated to the charging current data mentioned in Step 210 or can be a curve associated to the aforementioned one set of the plurality of sets of predetermined curve characteristic data. In another example, the aforementioned at least one curve characteristic of a curve under consideration may comprise an area below the curve under consideration within a time interval for the curve under consideration to fall from a first current value to a second current value, where the curve under consideration can be a curve associated to the charging current data mentioned in Step 210 or can be a curve associated to the aforementioned one set of the plurality of sets of predetermined curve characteristic data. This is for illustrative purposes only, and is not meant to be a limitation of the present invention. According to some variations of this embodiment, some calculations can be omitted by utilizing at least one predetermined table (e.g. one or more predetermined tables).

More particularly, in these variations, the information stored in the storage may comprise a predetermined table. In addition, within a plurality of predetermined parameters {P} respectively corresponding to the sets of predetermined curve characteristic data, the calculation module 116 determines a predetermined parameter P according to the predetermined table, where the contents of the predetermined table comprise the sets of predetermined curve characteristic data. For example, the contents of the predetermined table may comprise time interval values, each of which represents a time interval for a curve under consideration to fall from a first current value to a second current value, where the curve under consideration can be a curve associated to one set of the plurality of sets of predetermined curve characteristic data. In another example, the contents of the predetermined table may comprise area values, each of which represents an area below a curve under consideration within a time interval for the curve under consideration to fall from a first current value to a second current value, where the curve under consideration can be a curve associated to one set of the plurality of sets of predetermined curve characteristic data.

Figure 3:
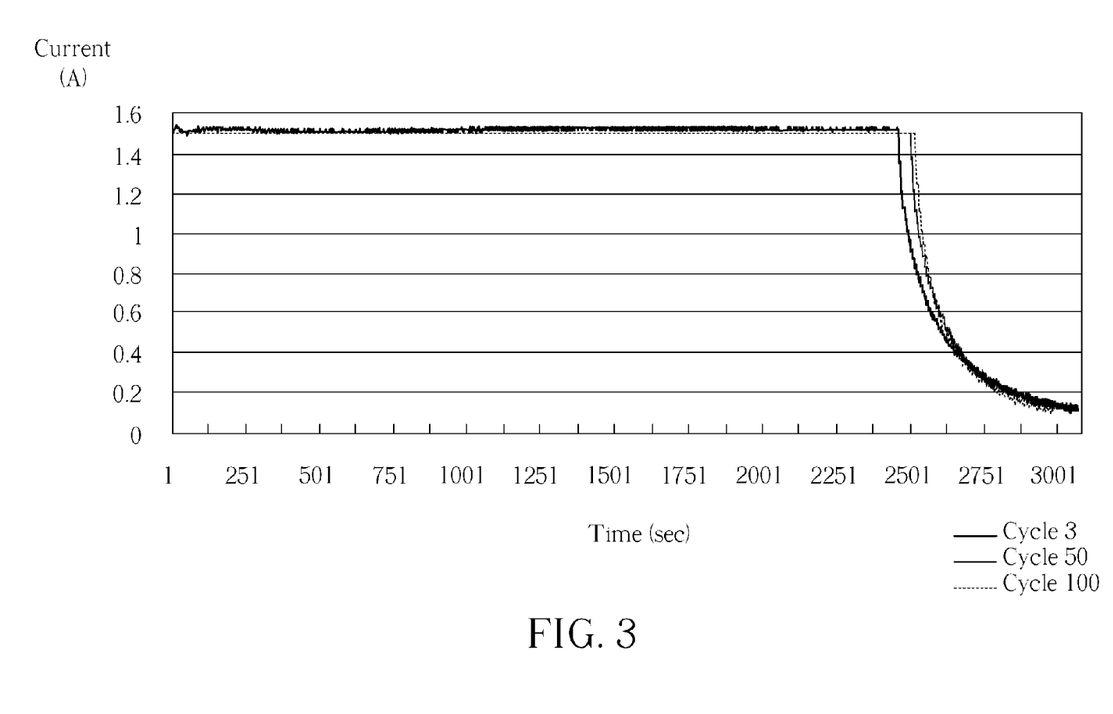
FIG. 3 illustrates some exemplary curves involved with the method shown in FIG. 2 according to an embodiment of the present invention, where a plurality of sets of predetermined curve characteristic data of the curves correspond to different predetermined cycle counts, respectively.

FIG. 3 illustrates some exemplary curves involved with the method 200 shown in FIG. 2 according to an embodiment of the present invention, where a plurality of sets of predetermined curve characteristic data of the curves correspond to different predetermined cycle counts, respectively. Please note that the sets of predetermined curve characteristic data of this embodiment can be taken as examples of the sets of predetermined curve characteristic data mentioned in the descriptions of Step 220.

In this embodiment, the horizontal axis represents time, which is measured in seconds (sec), while the vertical axis represents current (more particularly, possible current that may be detected to be the charging current $I_{CHG}$ mentioned in Step 210), which is measured in Amperes (A). As shown in FIG. 3, there are three curves whose sets of predetermined curve characteristic data respectively correspond to some predetermined cycle counts such as {3, 50, 100} (respectively labeled "Cycle 3", "Cycle 50", and "Cycle 100" in FIG. 3).

For each of the three curves shown in FIG. 3, there is a rapid drop since the charging of the battery switches from the CC condition to the CV condition.

Please note that the plurality of sets of predetermined curve characteristic data of the curves can be obtained in advance, for use of performing the curve mapping disclosed in Step 220. For example, the aforementioned at least one curve characteristic of a curve under consideration may comprise a time interval for the curve under consideration to fall from 1.4 (A) to 0.1 (A), where the curve under consideration can be the curve associated to the charging current data mentioned in Step 210 or can be the curve associated to the aforementioned one set of the plurality of sets of predetermined curve characteristic data. In another example, the aforementioned at least one curve characteristic of a curve under consideration may comprise an area below the curve under consideration within a time interval for the curve under consideration to fall from 1.4 (A) to 0.1 (A), where the curve under consideration can be the curve associated to the charging current data mentioned in Step 210 or can be the curve associated to the aforementioned one set of the plurality of sets of predetermined curve characteristic data.

Figure 4:
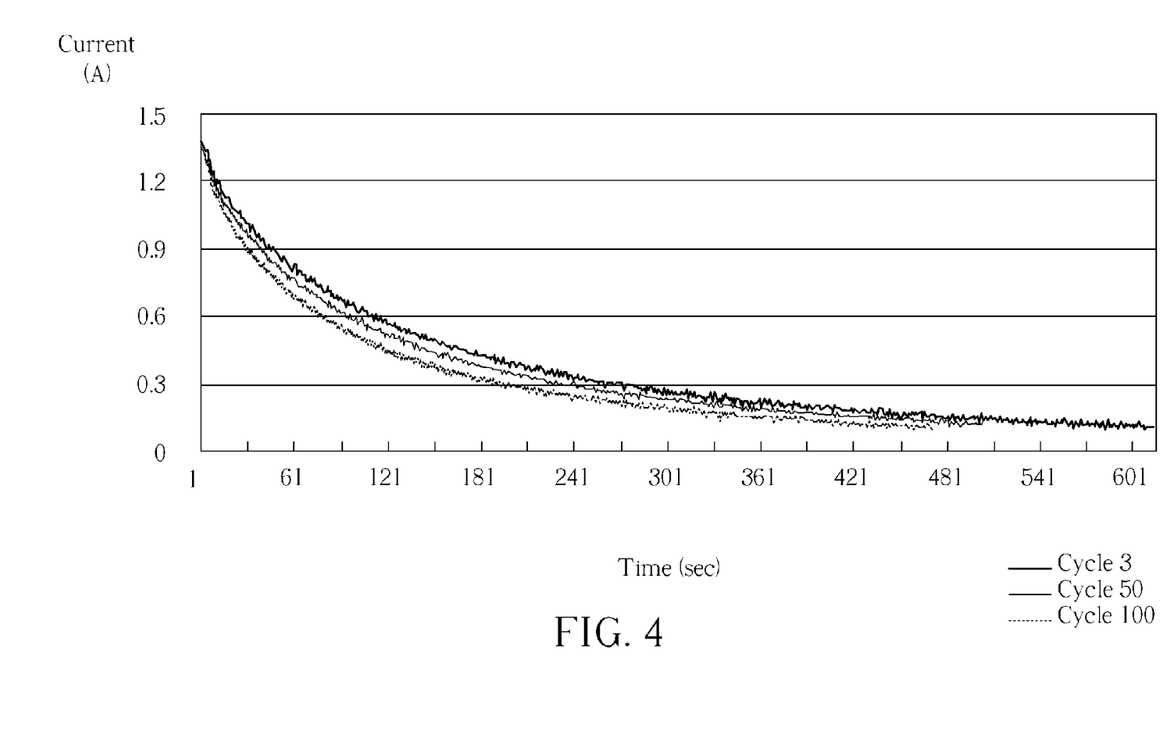
FIG. 4 illustrates some partial curves involved with the method shown in FIG. 2 according to an embodiment of the present invention, where the partial curves are cropped from the curves shown in FIG. 3 within a predetermined current interval.

FIG. 4 illustrates some partial curves involved with the method 200 shown in FIG. 2 according to an embodiment of the present invention, where the partial curves are respectively cropped from the curves shown in FIG. 3 within a predetermined current interval such as the interval [0.1, 1.4], measured in Amperes (A).

For better comprehension, the three partial curves are aligned at the left side, so the horizontal axis (or the time axis of this embodiment) shown in FIG. 4 represents relative time (labeled "Time (sec)", rather than "Relative time (sec)", for brevity). Please note that the three partial curves fall at varying speeds, respectively. More particularly, the initial falling speed of the curve corresponding to the cycle count of three (labeled "Cycle 3" in FIG. 4) is less than that of the curve corresponding to the cycle count of fifty (labeled "Cycle 50" in FIG. 4), while the initial falling speed of the curve corresponding to the cycle count of fifty (labeled "Cycle 50" in FIG. 4) is less than that of the curve corresponding to the cycle count of one hundred (labeled "Cycle 100" in FIG. 4). Thus, the plurality of sets of predetermined curve characteristic data of the curves (more particularly, the partial curves) are different, and therefore, can be utilized for determining whether the battery mentioned in Step 210 is a new battery or an old battery based upon the curve mapping disclosed in Step 220.

For example, in a situation where the curve associated to the charging current data mentioned in Step 210 matches the partial curve corresponding to the cycle count of three (labeled "Cycle 3" in FIG. 4) during the curve mapping disclosed in Step 220, the processing circuit 110 (more particularly, the calculation module 116) utilizes the predetermined parameter P corresponding to the selected set of predetermined curve characteristic data, whose cycle count is three (labeled "Cycle 3" in FIG. 4) in this situation, as the estimation parameter $P_E$ (e.g. the maximum power $Q_{MAX}$ mentioned above, i.e. the maximum possible power available in the battery). In another example, in a situation where the curve associated to the charging current data mentioned in Step 210 matches the partial curve corresponding to the cycle count of fifty (labeled "Cycle 50" in FIG. 4) during the curve mapping disclosed in Step 220, the processing circuit 110 (more particularly, the calculation module 116) utilizes the predetermined parameter P corresponding to the selected set of predetermined curve characteristic data, whose cycle count is fifty (labeled "Cycle 50" in FIG. 4) in this situation, as the estimation parameter $P_E$ (e.g. the maximum power $Q_{MAX}$ mentioned above, i.e. the maximum possible power available in the battery). In another example, in a situation where the curve associated to the charging current data mentioned in Step 210 matches the partial curve corresponding to the cycle count of one hundred (labeled "Cycle 100" in FIG. 4) during the curve mapping disclosed in Step 220, the processing circuit 110 (more particularly, the calculation module 116) utilizes the predetermined parameter P corresponding to the selected set of predetermined curve characteristic data, whose cycle count is one hundred (labeled "Cycle 100" in FIG. 4) in this situation, as the estimation parameter $P_E$ (e.g. the maximum power $Q_{MAX}$ mentioned above, i.e. the maximum possible power available in the battery).

According to some variations of this embodiment, after the charging of the battery switches from the CC condition to the CV condition, the processing circuit 110 can forcibly decrease the charging current $I_{CHG}$ to perform the current mapping disclosed in Step 220, where the decreased version of the charging current $I_{CHG}$, such as the decreased charging current $I_{CHG}'$, allows the current mapping to be performed in a flexible manner, rather than being performed in the CV condition only.

Figure 5:
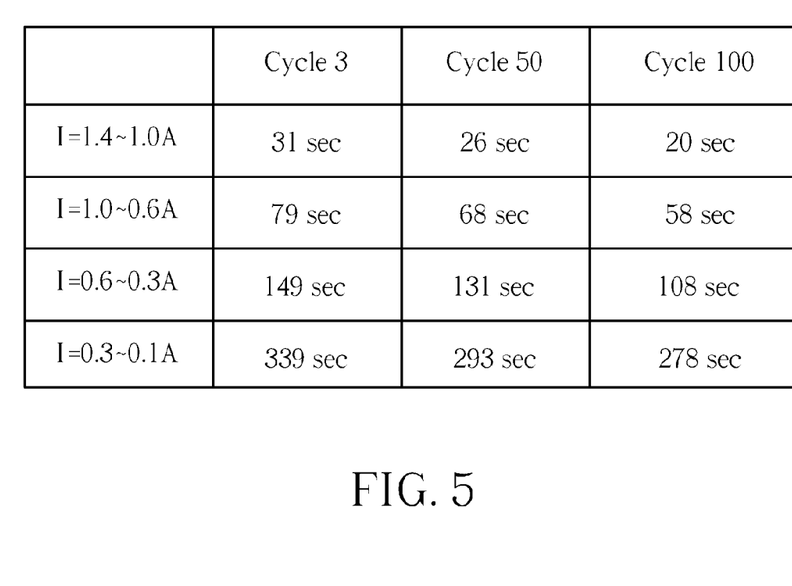
FIG. 5 illustrates a predetermined table involved with the method shown in FIG. 2 according to an embodiment of the present invention.

FIG. 5 illustrates a predetermined table involved with the method 200 shown in FIG. 2 according to an embodiment of the present invention. As shown in FIG. 5, the contents of the predetermined table may comprise time interval values (which are measured in seconds (sec)), each of which represents a time interval for a curve under consideration to fall from a first current value to a second current value, where the curve under consideration can be a curve associated to one set of the plurality of sets of predetermined curve characteristic data.

According to this embodiment, the plurality of sets of predetermined curve characteristic data may respectively correspond to some predetermined cycle counts such as {3, 50, 100} (respectively labeled "Cycle 3", "Cycle 50", and "Cycle 100" in FIG. 5). In addition, the first current value and the second current value may respectively represent 1.4 (A) and 1.0 (A) (whose interval is labeled "I=1.4~1.0 A" in FIG. 5), or represent 1.0 (A) and 0.6 (A) (whose interval is labeled "I=1.0~0.6 A" in FIG. 5), or represent 0.6 (A) and 0.3 (A) (whose interval is labeled "I=0.6~0.3 A" in FIG. 5), or represent 0.3 (A) and 0.1 (A) (whose interval is labeled "I=0.3~0.1 A" in FIG. 5). Additionally, the contents of the predetermined table, such as the time interval values {{31, 26, 20}, {79, 68, 58}, {149, 131, 108}, {339, 293, 278}} that are all measured in seconds (sec), can be utilized for determining whether the curve associated to the charging current data mentioned in Step 210 corresponds to any of the predetermined cycle counts {3, 50, 100}. As a result, the calculation module 116 can determine the estimation parameter $P_E$ (e.g. the maximum power $Q_{MAX}$ mentioned above, i.e. the maximum possible power available in the battery) to be one of the plurality of predetermined parameters {P} according to the predetermined table.

Suppose that, within the predetermined parameters {P}, those to be utilized as the estimation parameter $P_E$ such as the maximum power $Q_{MAX}$ mentioned above for the predetermined cycle counts {3, 50, 100} are {1102.342, 1097.646, 1095.422} (which are all measured in milliampere-hours (mAh)), respectively. For example, in a situation where it takes about 31 seconds for the curve associated to the charging current data mentioned in Step 210 to fall from 1.4 (A) and 1.0 (A) (e.g. it takes a time period that falls within a predetermined range around 31 seconds), the calculation module 116 determines the estimation parameter $P_E$ such as the maximum power $Q_{MAX}$ to be the predetermined parameter for the predetermined cycle count of three, i.e. 1102.342 (mAh). In another example, in a situation where it takes about 278 seconds for the curve associated to the charging current data mentioned in Step 210 to fall from 0.3 (A) and 0.1 (A) (e.g. it takes a time period that falls within a predetermined range around 278 seconds), the calculation module 116 determines the estimation parameter $P_E$ such as the maximum power $Q_{MAX}$ to be the predetermined parameter for the predetermined cycle count of one hundred, i.e. 1095.422 (mAh). Similar descriptions are not repeated for this embodiment.

Figure 6:
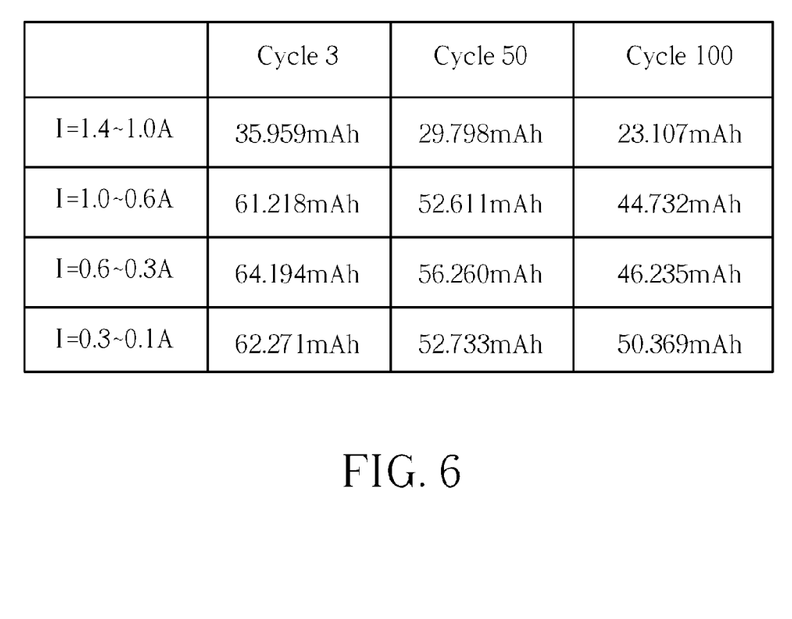
FIG. 6 illustrates a predetermined table involved with the method shown in FIG. 2 according to another embodiment of the present invention.

FIG. 6 illustrates a predetermined table involved with the method 200 shown in FIG. 2 according to another embodiment of the present invention. As shown in FIG. 6, the contents of the predetermined table may comprise area values (which are measured in milliampere-hours (mAh)), each of which represents an area below a curve under consideration within a time interval for the curve under consideration to fall from a first current value to a second current value, where the curve under consideration can be a curve associated to one set of the plurality of sets of predetermined curve characteristic data.

According to this embodiment, the plurality of sets of predetermined curve characteristic data may respectively correspond to some predetermined cycle counts such as {3, 50, 100} (respectively labeled "Cycle 3", "Cycle 50", and "Cycle 100" in FIG. 6). In addition, the first current value and the second current value may respectively represent 1.4 (A) and 1.0 (A) (whose interval is labeled "I=1.4~1.0 A" in FIG. 6), or represent 1.0 (A) and 0.6 (A) (whose interval is labeled "I=1.0~0.6 A" in FIG. 6), or represent 0.6 (A) and 0.3 (A) (whose interval is labeled "I=0.6~0.3 A" in FIG. 6), or represent 0.3 (A) and 0.1 (A) (whose interval is labeled "I=0.3~0.1 A" in FIG. 6). Additionally, the contents of the predetermined table, such as the area values {{35.959, 29.798, 23.107}, {61.218, 52.611, 44.732}, {64.194, 56.260, 46.235}, {62.271, 52.733, 50.369}} that are all measured in milliampere-hours (mAh), can be utilized for determining whether the curve associated to the charging current data mentioned in Step 210 corresponds to any of the predetermined cycle counts {3, 50, 100}. As a result, the calculation module 116 can determine the estimation parameter $P_E$ (e.g. the maximum power $Q_{MAX}$ mentioned above, i.e. the maximum possible power available in the battery) to be one of the plurality of predetermined parameters {P} according to the predetermined table.

Suppose that, within the predetermined parameters {P}, those to be utilized as the estimation parameter $P_E$ such as the maximum power $Q_{MAX}$ mentioned above for the predetermined cycle counts {3, 50, 100} are {1102.342, 1097.646, 1095.422} (which are all measured in milliampere-hours (mAh)), respectively. For example, in a situation where the area below the curve associated to the charging current data mentioned in Step 210 within a time interval for this curve to fall from 1.4 (A) and 1.0 (A) is equal to or close to 35.959 (mAh) (e.g. the area below the curve associated to the charging current data mentioned in Step 210 falls within a predetermined range around 35.959 (mAh)), the calculation module 116 determines the estimation parameter $P_E$ such as the maximum power $Q_{MAX}$ to be the predetermined parameter for the predetermined cycle count of three, i.e. 1102.342 (mAh). In another example, in a situation where the area below the curve associated to the charging current data mentioned in Step 210 within a time interval for this curve to fall from 0.3 (A) and 0.1 (A) is equal to or close to 50.369 (mAh) (e.g. the area below the curve associated to the charging current data mentioned in Step 210 falls within a predetermined range around 50.369 (mAh)), the calculation module 116 determines the estimation parameter $P_E$ such as the maximum power $Q_{MAX}$ to be the predetermined parameter for the predetermined cycle count of one hundred, i.e. 1095.422 (mAh). Similar descriptions are not repeated for this embodiment.

According to some variations of the embodiments/variations disclosed above, the charging current data may be replaced by the aforementioned charging voltage data, which can be obtained in the CC condition of charging the battery when needed. More particularly, in these variations, the processing circuit 110 may comprise a charging voltage monitoring module arranged to monitor the charging voltage $V_{CHG}$ of the battery to obtain the charging voltage data of the charging voltage $V_{CHG}$ with respect to time, and the processing circuit 110 (more particularly, the calculation module 116) is arranged to perform curve mapping according to the charging voltage data and according to a plurality of sets of predetermined curve characteristic data such as the aforementioned sets of predetermined curve characteristic data, in order to determine the estimation parameter $P_E$ (e.g. the maximum power $Q_{MAX}$ mentioned above, i.e. the maximum possible power available in the battery). Similar descriptions are not repeated for these variations.

It is an advantage of the present invention that the present invention method and apparatus allow power estimation to be performed accurately. As a result, the goal of increasing accuracy of power estimation can be achieved with ease, where the related art problems will no longer be an issue.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for accurately performing power estimation on a battery of an electronic device, the method comprising the steps of:

by utilizing a charging current monitoring module of a processing circuit of the electronic device, monitoring a charging current of the battery to obtain charging current data of the charging current with respect to time; and by utilizing a calculation module of the processing circuit of the electronic device, performing curve mapping according to the charging current data and according to a plurality of sets of predetermined curve characteristic data, in order to determine an estimation parameter corresponding to one of a plurality of predetermined cycle counts, wherein the estimation parameter is utilized for performing power estimation, and the sets of predetermined curve characteristic data respectively correspond to the predetermined cycle counts, which represent estimated ages of the battery, respectively, wherein the step of performing curve mapping according to the charging current data and according to the plurality of sets of predetermined curve characteristic data in order to determine the estimation parameter corresponding to one of the plurality of predetermined cycle counts further comprises:

within the plurality of sets of predetermined curve characteristic data, selecting a set of predetermined curve characteristic data that matches the charging current data;

within a plurality of predetermined parameters respectively corresponding to the sets of predetermined curve characteristic data, utilizing a predetermined parameter corresponding to the selected set of predetermined curve characteristic data as the estimation parameter; and comparing at least one curve characteristic associated to the charging current data with that associated to one set of the plurality of sets of predetermined curve characteristic data, in order to determine the selected set of predetermined curve characteristic data;

wherein the at least one curve characteristic of a curve under consideration comprises at least one curve characteristic index for the curve under consideration to fall from a first current value to a second current value; and the curve under consideration is a curve associated to the charging current data or a curve associated to the one set of the plurality of sets of predetermined curve characteristic data.

2. The method of claim 1, wherein the at least one curve characteristic index comprises a time interval for the curve under consideration to fall from the first current value to the second current value.

3. The method of claim 1, wherein the at least one curve characteristic index comprises an area below the curve under consideration within a time interval for the curve under consideration to fall from the first current value to the second current value.

4. The method of claim 1, wherein the estimation parameter represents a maximum possible power available in the battery.

5. The method of claim 4, wherein the one of the plurality of predetermined cycle counts is a latest cycle count that represents an estimated age of the battery.

6. An apparatus for accurately performing power estimation according to the method of claim 1, the apparatus comprising at least one portion of the electronic device, the apparatus comprising:

a current detector arranged to detect a charging current of the battery;

the processing circuit arranged to control operations of the electronic device, wherein the processing circuit comprises:

a time measurement unit arranged to perform time measurement; and a storage arranged to store information, wherein the information stored in the storage comprises the plurality of sets of predetermined curve characteristic data.

7. The apparatus of claim 6, wherein the at least one curve characteristic index comprises a time interval for the curve under consideration to fall from the first current value to the second current value.

8. The apparatus of claim 6, wherein the at least one curve characteristic index comprises an area below the curve under consideration within a time interval for the curve under consideration to fall from the first current value to the second current value.

9. The apparatus of claim 6, wherein the estimation parameter represents a maximum possible power available in the battery.

10. The apparatus of claim 9, wherein the one of the plurality of predetermined cycle counts is a latest cycle count that represents an estimated age of the battery.

11. A method for accurately performing power estimation on a battery of an electronic device, the method comprising the steps of:

by utilizing a charging current monitoring module of a processing circuit of the electronic device, monitoring a charging current of the battery to obtain charging current data of the charging current with respect to time; and by utilizing a calculation module of the processing circuit of the electronic device, performing curve mapping according to the charging current data and according to a plurality of sets of predetermined curve characteristic data, in order to determine an estimation parameter corresponding to one of a plurality of predetermined cycle counts, wherein the estimation parameter is utilized for performing power estimation, and the sets of predetermined curve characteristic data respectively correspond to the predetermined cycle counts, which represent estimated ages of the battery, respectively, wherein the step of performing curve mapping according to the charging current data and according to the plurality of sets of predetermined curve characteristic data in order to determine the estimation parameter corresponding to one of the plurality of predetermined cycle counts further comprises:

within the plurality of sets of predetermined curve characteristic data, selecting a set of predetermined curve characteristic data that matches the charging current data;

within a plurality of predetermined parameters respectively corresponding to the sets of predetermined curve characteristic data, utilizing a predetermined parameter corresponding to the selected set of predetermined curve characteristic data as the estimation parameter; and within the plurality of predetermined parameters respectively corresponding to the sets of predetermined curve characteristic data, determining the predetermined parameter according to a predetermined table, wherein contents of the predetermined table comprise the sets of predetermined curve characteristic data;

wherein the contents of the predetermined table comprise curve characteristic index values, each of which represents a curve characteristic index for a curve under consideration to fall from a first current value to a second current value; and the curve under consideration is a curve associated to one set of the plurality of sets of predetermined curve characteristic data.

12. The method of claim 11, wherein the curve characteristic index values comprise time interval values, each of which represents a time interval for the curve under consideration to fall from the first current value to the second current value.

13. The method of claim 11, wherein the curve characteristic index values comprise area values, each of which represents an area below the curve under consideration within a time interval for the curve under consideration to fall from the first current value to the second current value.

14. An apparatus for accurately performing power estimation according to the method of claim 11, the apparatus comprising at least one portion of the electronic device, the apparatus comprising:

a current detector arranged to detect a charging current of the battery;

the processing circuit, arranged to control operations of the electronic device, wherein the processing circuit comprises:

a time measurement unit arranged to perform time measurement; and a storage arranged to store information, wherein the information stored in the storage comprises the plurality of sets of predetermined curve characteristic data, wherein the information stored in the storage comprises the predetermined table.

15. The apparatus of claim 14, wherein the curve characteristic index values comprise time interval values, each of which represents a time interval for the curve under consideration to fall from the first current value to the second current value.

16. The apparatus of claim 14, wherein the curve characteristic index values comprise area values, each of which represents an area below the curve under consideration within a time interval for the curve under consideration to fall from the first current value to the second current value.

17. An apparatus for accurately performing power estimation on a battery of an electronic device, the apparatus comprising at least one portion of the electronic device, the apparatus comprising:

a voltage detector arranged to detect a charging voltage of the battery;

a processing circuit arranged to control operations of the electronic device, wherein the processing circuit comprises:

a time measurement unit arranged to perform time measurement;

a charging voltage monitoring module arranged to monitor the charging voltage of the battery to obtain charging voltage data of the charging voltage with respect to time; and a calculation module arranged to perform curve mapping according to the charging voltage data and according to a plurality of sets of predetermined curve characteristic data, in order to determine an estimation parameter corresponding to one of a plurality of predetermined cycle counts, wherein the estimation parameter is utilized for performing power estimation, and the sets of predetermined curve characteristic data respectively correspond to the predetermined cycle counts, which represent estimated ages of the battery, respectively, wherein within the plurality of sets of predetermined curve characteristic data, the calculation module selects a set of predetermined curve characteristic data that matches the charging voltage data, and within a plurality of predetermined parameters respectively corresponding to the sets of predetermined curve characteristic data, the calculation module utilizes a predetermined parameter corresponding to the selected set of predetermined curve characteristic data as the estimation parameter, wherein the calculation module compares at least one curve characteristic associated to the charging voltage data with that associated to one set of the plurality of sets of predetermined curve characteristic data, in order to determine the selected set of predetermined curve characteristic data; and a storage arranged to store information, wherein the information stored in the storage comprises the plurality of sets of predetermined curve characteristic data;

wherein the at least one curve characteristic of a curve under consideration comprises at least one curve characteristic index for the curve under consideration to fall from a first value to a second value; and the curve under consideration is a curve associated to the charging voltage data or a curve associated to the one set of the plurality of sets of predetermined curve characteristic data.

* * * * *